United States Patent
Shi et al.

(10) Patent No.: US 11,489,017 B2
(45) Date of Patent: Nov. 1, 2022

(54) DISPLAY PANEL, METHOD FOR PREPARING DISPLAY PANEL, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Kunyan Shi, Beijing (CN); Pohsien Wu, Beijing (CN)

(73) Assignees: Chengdu BOE Optoelectronics Technology Co., Ltd., Chengdu (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 16/928,121

(22) Filed: Jul. 14, 2020

(65) Prior Publication Data

US 2021/0193750 A1    Jun. 24, 2021

(30) Foreign Application Priority Data

Dec. 20, 2019    (CN) .......................... 201911327955.7

(51) Int. Cl.
     *H01L 27/32*      (2006.01)
     *H01L 51/56*      (2006.01)
     (Continued)

(52) U.S. Cl.
     CPC ........ *H01L 27/3218* (2013.01); *C23C 14/042* (2013.01); *H01L 51/5012* (2013.01);
     (Continued)

(58) Field of Classification Search
     CPC ............. H01L 27/3223; H01L 51/5012; H01L 51/5056; H01L 27/3211–3218
     See application file for complete search history.

(56) References Cited

U.S. PATENT DOCUMENTS 10,379,397 B1 *   8/2019   Tang .................... G09G 3/36
10,872,938 B2 *   12/2020   Cheng ............. H01L 27/3246
(Continued)

FOREIGN PATENT DOCUMENTS

CN      108470753 A1    8/2018
CN      110323346 A   *   10/2019   ......... H01L 27/3218
CN      110323346 A1    10/2019

OTHER PUBLICATIONS

Machine translation, Li, Chinese Pat. Pub. No. CN 110323346A, translation date: Jan. 7, 2022, Espacenet, all pages. (Year: 2022).*

(Continued)

*Primary Examiner* — Victoria K. Hall
(74) *Attorney, Agent, or Firm* — ArentFox Schiff LLP; Michael Fainberg (57) ABSTRACT

The disclosure provides a display panel, a method for preparing the display panel, and a display device. The display panel includes: a driving backplane, wherein the driving backplane comprises a display area, the display area is provided with a heterotypic edge, and the display area comprises a plurality of first pixel opening areas and a plurality of second pixel opening areas; wherein the plurality of first pixel opening areas are close to the heterotypic edge, and the plurality of second pixel opening areas are away from the heterotypic edge; and a light emitting structure, wherein the light emitting structure is arranged on the driving backplane and comprises a first functional layer, wherein each of the second pixel opening areas is completely covered by the first functional layer, and each of the first pixel opening areas is partially covered by the first functional layer.

14 Claims, 3 Drawing Sheets

(51) Int. Cl.
*H01L 51/50* (2006.01)
*C23C 14/04* (2006.01)
*C23C 14/24* (2006.01)

(52) U.S. Cl.
CPC .......... *H01L 51/5056* (2013.01); *H01L 51/56* (2013.01); *C23C 14/24* (2013.01); *H01L 27/3211* (2013.01); *H01L 27/3223* (2013.01); *H01L 27/3246* (2013.01)

(56) References Cited

U.S. PATENT DOCUMENTS

| | | | | |
|---|---|---|---|---|
| 11,139,345 B2* | 10/2021 | Chen | | G02F 1/133504 |
| 11,233,097 B2* | 1/2022 | Lee | | H01L 27/3211 |
| 11,256,127 B2* | 2/2022 | Wang | | H01L 27/3211 |
| 11,282,898 B2* | 3/2022 | Wang | | H01L 27/3276 |
| 2013/0002127 A1* | 1/2013 | Jeong | | H01L 51/5265 313/503 |
| 2016/0218124 A1* | 7/2016 | Wang | | H01L 27/1288 |
| 2016/0343944 A1* | 11/2016 | Lee | | H01L 51/56 |
| 2018/0026080 A1* | 1/2018 | Lee | | B60K 35/00 257/40 |
| 2018/0144675 A1* | 5/2018 | Lee | | H01L 27/326 |
| 2018/0269397 A1* | 9/2018 | Xin | | H01L 51/001 |
| 2018/0337217 A1* | 11/2018 | Zang | | H01L 51/0096 |
| 2019/0088709 A1* | 3/2019 | Zeng | | H01L 27/1218 |
| 2019/0140026 A1* | 5/2019 | Nakanishi | | G02F 1/133512 |
| 2019/0173011 A1* | 6/2019 | Kwak | | H01L 27/3246 |
| 2019/0181201 A1* | 6/2019 | Kim | | H01L 51/5234 |
| 2019/0206973 A1* | 7/2019 | Kim | | H01L 51/5212 |
| 2019/0305057 A1* | 10/2019 | Cheng | | H01L 51/5036 |
| 2020/0202817 A1* | 6/2020 | Li | | G09G 5/30 |
| 2020/0219944 A1* | 7/2020 | Yi | | H01L 27/3244 |
| 2021/0066428 A1* | 3/2021 | Tao | | G09G 3/3233 |
| 2021/0202611 A1* | 7/2021 | Kim | | H01L 27/3246 |
| 2021/0202615 A1* | 7/2021 | Kim | | H01L 27/3246 |
| 2021/0233967 A1* | 7/2021 | Chen | | G02F 1/133388 |

OTHER PUBLICATIONS

Office Action from corresponding Chinese application 201911327955.7 dated Nov. 29, 2021.

* cited by examiner

DISPLAY PANEL, METHOD FOR PREPARING DISPLAY PANEL, AND DISPLAY DEVICE

The present application claims the priority from Chinese Patent Application No. 201911327955.7, filed with the Chinese Patent Office on Dec. 20, 2019, and entitled "DISPLAY PANEL, METHOD FOR PREPARING DISPLAY PANEL, AND DISPLAY DEVICE", which is hereby incorporated by reference in its entirety.

TECHNICAL FIELD

The disclosure relates to the technical field of display, in particular to a display panel, a method for preparing a display panel, and a display device.

BACKGROUND ART

In the organic light-emitting diode (OLED) application field, there are some OLED products that do not have conventional square contours. These OLED products are called heterotypic OLED products whose contours are more complex. For example, a lamp piece of a car lamp generally has an arc-shaped contour.

SUMMARY

The disclosure provides a display panel, a method for preparing a display panel, and a display device. The display panel includes:

a driving backplane, wherein the driving backplane includes a display area, the display area is provided with a heterotypic edge, and the display area includes a plurality of first pixel opening areas and a plurality of second pixel opening areas; wherein the plurality of first pixel opening areas are close to the heterotypic edge, and the plurality of second pixel opening areas are away from the heterotypic edge; and a light emitting structure, wherein the light emitting structure is arranged on the driving backplane and includes a first functional layer, wherein each of the second pixel opening areas is completely covered by the first functional layer, and each of the first pixel opening areas is partially covered by the first functional layer;

wherein an edge part, covering the first pixel opening areas, of the first functional layer is a smooth edge; and an area, where the first functional layer covers, of the first pixel opening areas and the second pixel opening areas is an effective display area.

Optionally, the first functional layer includes at least one of a hole injection layer, a hole transport layer, a luminescent material layer, an electron transport layer or an electron injection layer.

Optionally, each film layer in the first functional layer is a continuous whole film layer.

Optionally, edges of the portions, arranged in the first pixel opening areas, of the film layers in the first functional layer are aligned.

Optionally, the light emitting structure includes OLED devices in one color; and each film layer in the first functional layer is a continuous whole film layer.

Optionally, the luminescent material layer and/or the hole transport layer are/is configured as the first functional layer.

Optionally, the light emitting structure includes OLED devices in different colors; and the first functional layer includes at least two functional layers, and one or two of the hole injection layer, the hole transport layer, the luminescent material layer, the electron transport layer and the electron injection layer are provided with patterns.

Optionally, the first functional layer includes the hole transport layer.

Optionally, the display area further includes third pixel opening areas, wherein the third pixel opening areas are arranged between the first pixel opening areas and the heterotypic edge of the display area.

Optionally, sizes of the first pixel opening areas, sizes of the second pixel opening areas and sizes of the third pixel opening areas are the same.

Optionally, the driving backplane includes a pixel defining structure, wherein the pixel defining structure is configured to form the first pixel opening areas, the second pixel opening areas and third pixel opening areas which define the display area.

Optionally, the display panel further includes a first electrode layer arranged on a side, facing away from the driving backplane, of the light emitting structure, and the first electrode layer completely covering the display area.

A display device includes any one of the display panels described above.

A method for preparing a display panel includes:

forming a light emitting structure on a driving backplane;

forming a plurality of first pixel opening areas close to a heterotypic edge and a plurality of second pixel opening areas away from the heterotypic edge in a display area of the driving backplane, wherein the display area is provided with the heterotypic edge; and forming a first functional layer in the light emitting structure; wherein each of the second pixel opening areas is completely covered by the first functional layer, and each of the first pixel opening areas is partially covered by the first functional layer; an edge part, covering the first pixel opening areas, of the first functional layer is a smooth edge; and an area, where the first functional layer covers, of the first pixel opening areas and the second pixel opening areas is an effective display area.

Optionally, said forming the first functional layer in the light emitting structure includes:

evaporating film layers of the first functional layer sequentially by an evaporation process, wherein the first functional layer includes at least one of a hole injection layer, a hole transport layer, a luminescent material layer, an electron transport layer or an electron injection layer.

Optionally, said evaporating the film layers of the first functional layer sequentially by the evaporation process includes:

sharing, by the film layers in the first functional layer, one mask to conduct evaporation.

DETAILED DESCRIPTION OF THE EMBODIMENTS

Hereinafter, the technical solution in the embodiments of the disclosure will be described clearly and completely in conjunction with the drawings in the embodiments of the disclosure. Obviously, the described embodiments are only part of the embodiments of the disclosure, not all of the embodiments. Based on the embodiments of the disclosure, all other embodiments obtained by those of ordinary skill in the art without creative labor are within the scope of the disclosure.

For heterotypic OLED products, due to the limitation of the size of pixel opening, pixel arrangement cannot be well matched with the heterotypic contour, thus causing the appearance of jagged edges after turn-on, which may affect the visual effect and weaken the subjective feeling.

As shown in FIGS. 1 to 6, an embodiment of the disclosure provides a display panel, including:

a driving backplane 1, wherein the driving backplane 1 includes a display area, the display area is provided with a heterotypic edge 100, and the display area includes a plurality of first pixel opening areas 11 and a plurality of second pixel opening areas 12; wherein the plurality of first pixel opening areas 11 are close to the heterotypic edge 100, and the plurality of second pixel opening areas 12 are away from the heterotypic edge 100; and a light emitting structure 2, wherein the light emitting structure 2 is arranged on the driving backplane 1 and includes a plurality of functional layers, wherein the plurality of functional layers include a first functional layer 20, each second pixel opening area 12 is completely covered by the first functional layer 20, and each first pixel opening area 11 is only partially covered by the first functional layer 20;

wherein an edge part 200, covering the first pixel opening areas 11, of the first functional layer 20 is a smooth edge; and an area, where the first functional layer 20 covers, of the first pixel opening areas 11 and the second pixel opening areas 12 is an effective display area.

Specifically, in the disclosure, the 'pixel opening areas' correspond to sub-pixel openings, and each 'pixel opening area' corresponds to a projection of a sub-pixel opening.

Figure 1:
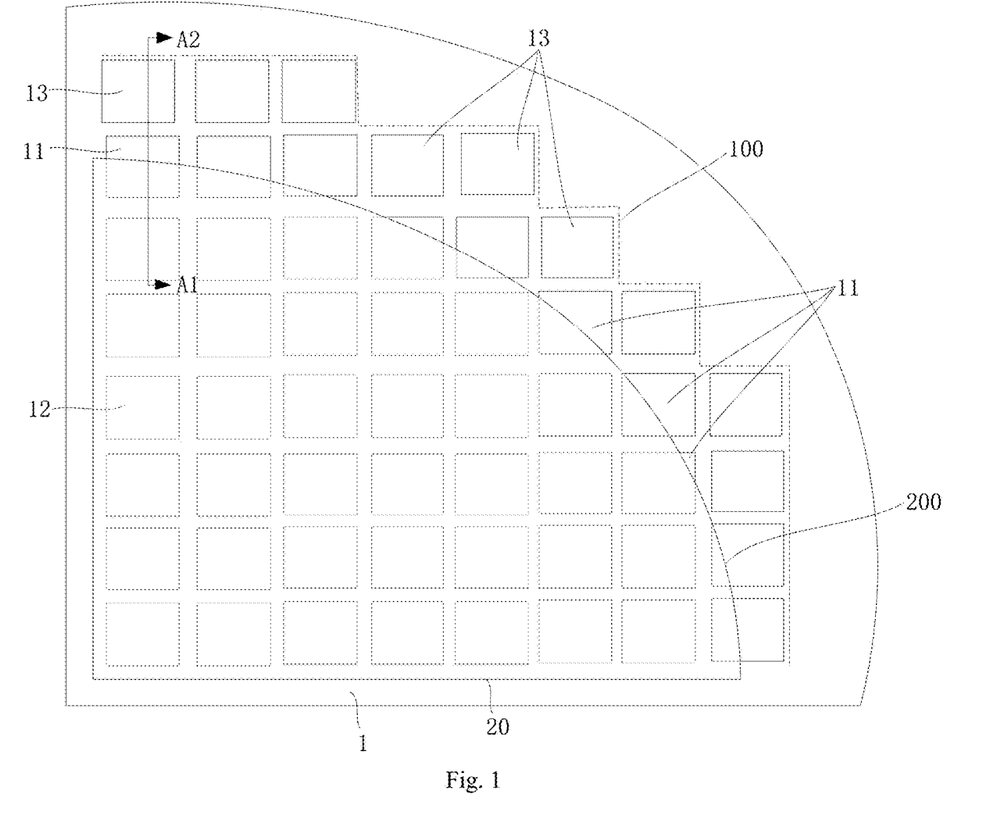
FIG. 1 illustrates a partial structural schematic diagram of a display panel according to an embodiment of the disclosure.

Specifically, in the disclosure, the 'display area' refers to a sub-pixel arrangement area of the driving backplane, and the edge of the display area surrounds all sub-pixels and extends along the edge sub-pixels; and the 'heterotypic edge' refers to a section, in a jagged form due to the arrangement of the edge sub-pixels, of the edge of the display area. As shown in FIG. 1, the above-mentioned heterotypic edge 100 may be only part of the edge of the display area, of course, it may also be the entire edge of the display area.

Specifically, the 'smooth edge' means that the edge boundary is a smooth line. As shown in FIG. 1, the 'smooth edge' can change with the bending of the edge contour of the driving backplane and is roughly similar to the edge contour of the driving backplane in shape. For example, at a fillet area of the driving backplane, the 'smooth edge' may be a smooth arc; at a wavy border area of the driving backplane, the 'smooth edge' may be a smooth wavy line; and when the edge of the driving backplane is a circular contour, the 'smooth edge' may be a circular arc.

The display panel provided by the embodiment of the disclosure includes the driving backplane 1 and the light emitting structure 2; wherein the display area of the driving backplane 1 is provided with the heterotypic edge 100, that is, the display panel is a heterotypic panel; and the light emitting structure 2 is provided with a plurality of functional layers covering the display area for realizing light emission. In a conventional heterotypic panel, the edges of all functional layers of a light emitting structure go beyond the edge of a display area, and pixel opening areas in the display area are effective display areas, as a result, after the panel is turned on, all the pixel opening areas emit light, and a jagged form formed by the arrangement of edge sub-pixels of the display area is presented at the edges of the effective display areas, that is, a heterotypic edge is presented. However, in the embodiment of the disclosure, the first functional layer 20 in the light emitting structure 2 does not cover the whole display area, specifically, each of the first pixel opening areas 11 near the heterotypic edge 100 is only partially covered by the first functional layer 20, in other words, the edge part 200, near the heterotypic edge 100, of the first functional layer 20 is within the first pixel opening areas 11 (in the display area). Since the area, where the first functional layer 20 covers, of the first pixel opening areas 11 and the second pixel opening areas 12 defines the effective display area, after the panel is turned on, all the second pixel opening areas 12 emit light, and only partial first pixel opening areas 11 emit light, so the edge part 200 (smooth edge) of the first functional layer 20 on the first pixel opening areas 11 is presented, instead of the heterotypic edge 100 of the display area. Therefore, in the heterotypic display panel according to the embodiment of the disclosure, jagged edges will not appear, so that the visual experience of products can be improved.

Figure 3:
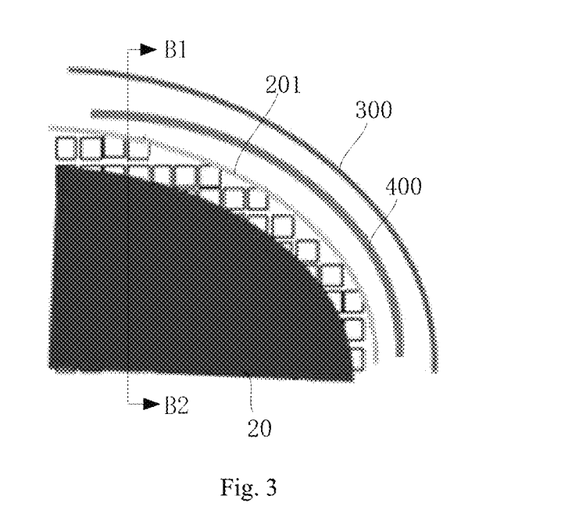
FIG. 3 illustrates a partial structural schematic diagram of a display panel according to another embodiment of the disclosure.

Specifically, as shown in FIG. 3, in the light emitting structure, edges 201 of the functional layers other than the first functional layer 20 all go beyond the edge of the display area, that is, the functional layers other than the first functional layer 20 cover all the pixel opening areas in the display area.

In a specific embodiment, as shown in FIG. 1, the display area of the driving backplane 1 further includes third pixel opening areas 13, and the third pixel opening areas 13 are located between the first pixel opening areas 11 and the heterotypic edge 100 of the display area. Specifically, the third pixel opening areas 13 are adjacent to the heterotypic edge 100 and are not covered by the first functional layer 20, thus belonging to an ineffective display area. That is, when the display panel is turned on, the third pixel opening areas 13 do not emit light, so they can also be called dummy pixel opening areas. The third pixel opening areas 13 can separate the heterotypic edge 100 from the effective display areas by a set distance to better avoid the display of jagged edges.

Specifically, the spacing between the heterotypic edge 100 and the smooth edge of the first functional layer 20 may be set to a spacing of one to three third pixel opening areas 13. Specifically, between the heterotypic edge 100 and the smooth edge of the first functional layer 20, one to three circles of third pixel opening areas 13 may be arranged along the contour of the heterotypic edge or the smooth edge.

Specifically, the sizes of the first pixel opening areas 11, the sizes of the second pixel opening areas 12 and the sizes of the third pixel opening areas 13 are the same.

In an embodiment, the driving backplane includes a pixel defining structure (PDL) 4, and the PDL 4 is configured to form the pixel opening areas defining the display area. In other words, the edge shape of the display area is determined by the arrangement form of edge sub-pixels defined by the PDL 4. The dashed line boundary shown in FIG. 1 is the edge shape of the display area.

Figure 2:
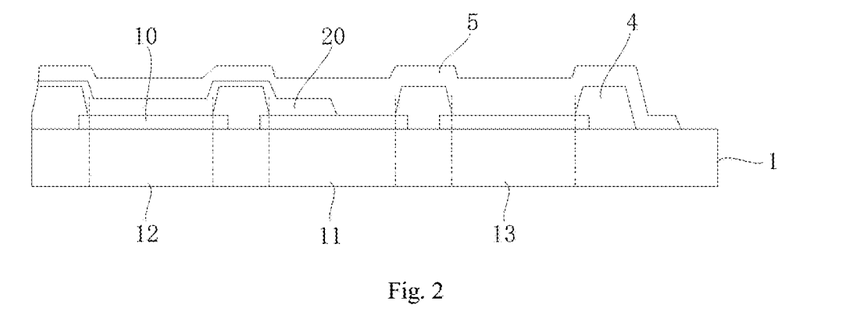
FIG. 2 illustrates a cross-sectional structural schematic diagram, in the direction A1-A2 in FIG. 1, of a display panel according to an embodiment of the disclosure.

In an embodiment, as shown in FIG. 2, the display panel provided by the embodiment of the disclosure further includes a first electrode layer 5 located on the side, facing away from the driving backplane 1, of the light emitting structure 2, and the first electrode layer 5 completely covering the display area. As shown in FIG. 3, an edge 300 of the first electrode layer may go beyond the edge of the display area, and the first electrode layer completely covers the display area.

Specifically, the first electrode layer is a cathode layer. As shown in FIG. 3, a peripheral cathode trace (VSS) 400 electrically connected to the cathode layer is located between the edges 201 of the functional layers and the edge 300 of the cathode layer, and is disposed around the display area. In some embodiments, the cathode layer may not completely cover the peripheral cathode trace (VSS) 400, or the edge 300 of the cathode layer is located on the side, close to the inside of the display area, of the cathode trace (VSS) 400, for example, partially overlapping, or being connected through other conductive layers.

Of course, as shown in FIG. 2, in the display panel according to the embodiment of the disclosure, the driving backplane 1 further includes second electrodes 10 in one-to-one correspondence to the pixel opening areas, and the orthographic projection of each pixel opening area is within the orthographic projection of the corresponding second electrode 10, that is, the projections of the second electrodes 10 completely cover the projections of the pixel opening areas in the display area. Specifically, the second electrodes 10 are anodes.

Specifically, as shown in FIG. 2, the size of the second electrode 10 corresponding to the first pixel opening area 11, the size of the second pixel opening area 12, and the size of the third pixel opening area 13 are the same; and the shape of the second electrode 10 corresponding to the first pixel opening area 11, the shape of the second pixel opening area 12, and the shape of the third pixel opening area 13 are the same. In some embodiments, if the second pixel opening areas 12 inside the display area include light emitting structures emitting different colors of light, the second electrodes 10 corresponding to the second pixel opening areas 12 may have different shapes and sizes; for example, the shape of the second electrode corresponding to the light emitting structure emitting red light, the shape of the second electrode corresponding to the light emitting structure emitting green light and the shape of the second electrode corresponding to the light emitting structure emitting blue light are different; and the size of the second electrode corresponding to the light emitting structure emitting red light, the size of the second electrode corresponding to the light emitting structure emitting green light and the size of the second electrode corresponding to the light emitting structure emitting blue light are different; or the shapes and sizes of the second electrodes corresponding to the light emitting structures in two colors are different, then the second electrode corresponding to a first pixel opening area 11 may correspondingly have the same shape and size as the second electrode 10 corresponding to the light emitting structure in one color in the display area, and the second electrode 10 corresponding to a third pixel opening area 13 may correspondingly have the same shape and size as the second electrode 10 corresponding to the light emitting structure in one color in the display area. In some embodiments, the shapes and sizes of the second electrodes 10 corresponding to the first pixel opening areas 11 are partially the same. In some embodiments, the shapes and sizes of the second electrodes 10 corresponding to the third pixel opening areas 13 are partially the same and partially different. In some embodiments, second electrodes 10 may not be arranged for the third pixel opening areas 13. In some embodiments, according to the pixel arrangement structure, the luminescent material layer in the third pixel opening areas 13 corresponding to the position of the subpixel of the same color may be the same as the luminescent material layer in the second pixel opening areas 12, i.e. completely covering pixel openings; and the luminescent material layer in the first pixel opening areas 11 corresponding to the position of the subpixel of the same color may be the same as the luminescent material layer in the second pixel opening areas 12, i.e. completely covering pixel openings. For example, the luminescent material layer in the first pixel opening area 11 and the luminescent material layer in the third pixel opening area 13 are manufactured with the same process as the luminescent material layer in the second pixel opening area 12, for example, the luminescent material of the same color is evaporated by an evaporation process, so that the quality of film layers in the luminescent material layer in the second pixel opening areas 12 inside the display area is more reliable and uniform, thus ensuring the display quality of an actual luminescent area.

Specifically, by changing the manufacturing and patterning of the PDL, each edge sub-pixel opening is heterotypic, thus making the edge of the display area regular. This solution can also avoid the display of jagged edges. However, due to the heavy workload of heterotypic drawing of each sub-pixel and the difficulty in controlling the heterotypic angle in the drawing process, this solution is difficult to design and realize. In the embodiment of the disclosure, the size of an opening of an open mask used in evaporation of an organic functional layer can be appropriately reduced, so that the heterotypic edge of the display area does not emit light by reducing the evaporation area, thus avoiding the display of jagged edges. Obviously, the solution of the embodiment of the disclosure is simpler and easier to implement.

Figure 4:
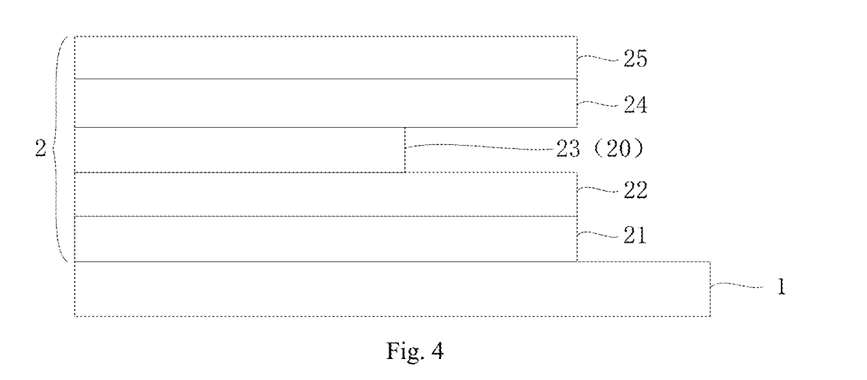
FIG. 4 illustrates a partial cross-sectional structural schematic diagram, in the direction B1-B2 in FIG. 3, of a display panel according to an embodiment of the disclosure.
Figure 5:
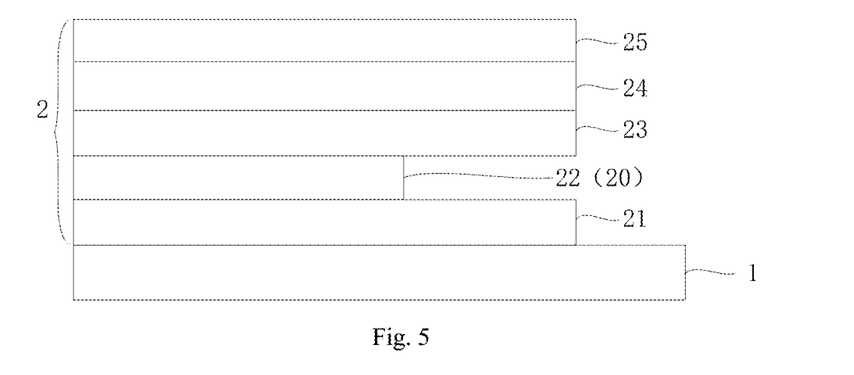
FIG. 5 illustrates a partial cross-sectional structural schematic diagram, in the direction B1-B2 in FIG. 3, of a display panel according to another embodiment of the disclosure.
Figure 6:
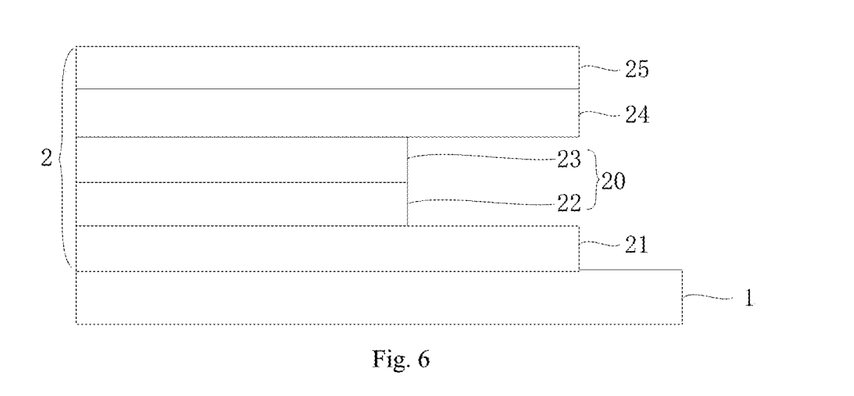
FIG. 6 illustrates a partial cross-sectional structural schematic diagram, in the direction B1-B2 in FIG. 3, of a display panel according to another embodiment of the disclosure.

In a specific embodiment, as shown in FIGS. 4 to 6, in the embodiment of the disclosure, a plurality of functional layers of the light emitting structure 2 include at least one of a hole injection layer 21, a hole transport layer 22, a luminescent material layer 23, an electron transport layer 24 or an electron injection layer 25; and the first functional layer 20 includes at least one of the plurality of functional layers.

In a specific embodiment, edges of the portions, located in the first pixel opening areas, of the film layers in the first functional layer 20 are aligned. In some embodiments, the first functional layer 20 includes a luminescent material layer and at least one of the hole injection layer 21, the hole transport layer 22, the electron transport layer 24 or the electron injection layer 25. The luminescent material layer is patterned and covers at least the second pixel opening areas and part of the first pixel opening areas. At least one of the hole injection layer 21, the hole transport layer 22, the electron transport layer 24 or the electron injection layer 25 is a whole film layer. Edges of the portions, located in the first pixel opening areas, of at least one of the luminescent layer, the hole injection layer 21, the hole transport layer 22, the electron transport layer 24 or the electron injection layer 25 are aligned.

Edges of the portions, located in the first pixel opening areas, of the functional layers in the first functional layer 20 are aligned, so that the functional layers in the first functional layer 20 can share one mask or one kind of masks, thereby simplifying the evaporation process and reducing cost. Specifically, 'one kind of masks' refers to masks with the same opening pattern.

In a specific embodiment, each film layer in the first functional layer 20 is a continuous whole film layer. That is, each functional layer in the first functional layer 20 is a whole film layer covering the effective display areas instead of patterns distributed in an array corresponding to sub-pixel openings. As a result, each functional layer can adopt an open mask, and an evaporation opening of the open mask is a large opening covering sub-pixel openings instead of an opening array in one-to-one correspondence to sub-pixel openings. In this way, by reducing the area of the large opening, an evaporation edge of the first functional layer 20 is within the heterotypic edge 100 of the display area, so that the heterotypic edge 100 of the display area does not emit light, thereby preventing the appearance of jagged edges. The embodiment of the disclosure has very simple requirements on an opening pattern of the mask and is very easy to realize.

Specifically, the 'continuous whole film layer' refers to a film layer evaporated as a whole. However, due to the presence of some film layers such as the pixel defining layer on a driving substrate, the surface of the substrate will have relatively large segment differences, which may lead to film layer breakage, but the projection of the film layer on the substrate is continuous. Therefore, in the embodiment of the disclosure, the 'continuous whole film layer' refers to the continuous projection of the film layer, including the case of film layer breakage.

In a specific embodiment, the light emitting structure 2 includes OLED devices in one color, and each film layer in the plurality of functional layers of the light emitting structure 2 is a continuous whole film layer. In this way, the mask requirement on each film layer is very simple, and each film layer may be configured as the first functional layer 20.

Illustratively, as shown in FIG. 4, specifically, the luminescent material layer 23 may be configured as the first functional layer 20, or, as shown in FIG. 5, the hole transport layer 22 may be configured as the first functional layer 20, or, as shown in FIG. 6, the luminescent material layer 23 and the hole transport layer 22 may be jointly configured as the first functional layer 20.

In another specific embodiment, the light emitting structure 2 includes OLED devices in different colors, a plurality of functional layers include at least two functional layers, and one or two of the hole injection layer 21, the hole transport layer 22, the luminescent material layer 23, the electron transport layer 24 and the electron injection layer 25 are provided with patterns.

Specifically, the light emitting structure 2 may include OLED devices in three colors, i.e., red, green and blue colors.

In some embodiments, among the plurality of functional layers of the light emitting structure 2, except for the luminescent material layer 23, each film layer is a continuous whole film layer, and the luminescent material layer 23 is provided with patterns distributed in an array, and includes luminescent materials for light emitting devices in different colors, which need to be evaporated separately. In this way, except for the luminescent material layer 23, the mask requirement on each film layer is very simple, and each film layer may be configured as the first functional layer 20.

In some embodiments, the hole transport layer 22 may also be provided with patterns distributed in an array. In order to adjust the light emitting colors of sub-pixels in various colors, the thickness of the hole transport layer 22 may vary for sub-pixels in various colors.

Illustratively, as shown in FIG. 5, the first functional layer 20 may include the hole transport layer 22.

Specifically, the film layers in the first functional layer may not be whole film layers but be provided with patterns distributed in an array. For the functional layer with patterns, evaporation may be conducted by overlaying an open mask with a fine metal mask (FMM). The patterns can be obtained through the FMM, and the edge of the functional layer can be defined by the open mask. For example, among the plurality of functional layers, the luminescent material layer is provided with patterns distributed in an array, and the luminescent material layer may be configured as the first functional layer. Specifically, evaporation may be conducted by overlaying the open mask with the FMM, and the evaporation edge of the luminescent material layer can be adjusted by changing the opening of the open mask. Alternatively, when the hole transport layer is provided with patterns distributed in an array, the hole transport layer may also be configured as the first functional layer.

The embodiments of the disclosure also provide a display device, including any one of the display panels described above.

Specifically, the display device may be a heterotypic product, specifically may be a lighting device, such as a lamp piece of a car lamp, or a display, a tablet personal computer, a smart phone, etc.

Based on the same lighting conception as the display panel according to the embodiments of the disclosure, the embodiments of the disclosure further provide a method for preparing a display panel, including:

as shown in FIGS. 1 to 6, forming a light emitting structure 2 on a driving backplane 1;

forming a plurality of first pixel opening areas 11 close to a heterotypic edge 100 and a plurality of second pixel opening areas 12 away from the heterotypic edge 100 in a display area of the driving backplane 1, wherein the display area is provided with a heterotypic edge 100; and forming a first functional layer 20 in the light emitting structure 2, wherein each second pixel opening area 12 is completely covered by the first functional layer 20, and each first pixel opening area 11 is only partially covered by the first functional layer 20; an edge part 200, covering the first pixel opening areas 11, of the first functional layer 20 is a smooth edge; and an area, where the first functional layer 20 covers, of the first pixel opening areas 11 and the second pixel opening areas 12 is an effective display area.

In a specific embodiment, the operation of forming the first functional layer in the light emitting structure includes:

evaporating film layers of the first functional layer sequentially by an evaporation process, wherein the first functional layer includes at least one of a hole injection layer, a hole transport layer, a luminescent material layer, an electron transport layer or an electron injection layer.

In a specific embodiment, the operation of evaporating the film layers of the first functional layer sequentially by the evaporation process includes:

sharing, by the film layers in the first functional layer, one mask or one kind of masks to conduct evaporation.

Specifically, each functional layer in the first functional layer may be a whole film layer covering the effective display area, each film layer in the first functional layer may adopt an open mask, and an evaporation opening of the open mask is a large opening covering sub-pixel openings instead of an array of openings in one-to-one correspondence to sub-pixel openings. In this way, by reducing the area of the large opening, an evaporation edge of the first functional layer is within the heterotypic edge of the display area, so that the heterotypic edge of the display area does not emit light, thereby preventing the appearance of jagged edges.

Specifically, the first functional layer may also include a film layer with patterns. For the functional layer with patterns, evaporation may be conducted by overlaying an open mask with a fine metal mask (FMM). The patterns can be obtained through the FMM, and the edge of the functional layer can be defined by the open mask. For example, among the plurality of functional layers, the luminescent material layer is provided with patterns distributed in an array, and the luminescent material layer may be configured as the first functional layer. Specifically, evaporation may be conducted by overlaying the open mask with the FMM, and the evaporation edge of the luminescent material layer can be adjusted by changing the opening of the open mask. Alternatively, when the hole transport layer is provided with patterns distributed in an array, the hole transport layer may also be configured as the first functional layer.

In a specific embodiment, the functional layers, except the first functional layer, completely cover the pixel opening areas in the display area, and the functional layers, except the first functional layer, may also share one mask or one kind of masks.

In a specific embodiment, as shown in FIG. 2, before preparing the light emitting structure on the driving backplane 1, the method further includes the step of preparing a pixel defining structure 4 on the driving backplane 1. Further, after the light emitting structure is prepared on the driving backplane 1, the method also includes the step of preparing second electrodes 6 and an encapsulation layer (not shown in the figure) on the driving backplane 1 sequentially. Specifically, the preparation process of the display panel according to the embodiment of the disclosure generally includes: (1) preparing the second electrodes 10 on the driving backplane 1, (2) preparing the pixel defining structure 4, (3) evaporating the light emitting structure (including the first functional layer 20), (4) preparing a first electrode layer 5, (5) preparing the encapsulation layer.

Obviously, those skilled in the art can make various changes and modifications to the embodiments of the disclosure without departing from the spirit and scope of the disclosure. Thus, if these modifications and variations of the disclosure fall within the scope of the claims of the disclosure and their equivalents, the disclosure is also intended to include these modifications and variations.

What is claimed is:

1. A display panel, comprising:
a driving backplane, wherein the driving backplane comprises a display area, the display area is provided with a heterotypic edge, and the display area comprises a plurality of first pixel opening areas and a plurality of second pixel opening areas; wherein the plurality of first pixel opening areas are close to the heterotypic edge, and the plurality of second pixel opening areas are away from the heterotypic edge; and
a light emitting structure, wherein the light emitting structure is arranged on the driving backplane and comprises a first functional layer, wherein each of the second pixel opening areas is completely covered by the first functional layer, and each of the first pixel opening areas is partially covered by the first functional layer;
wherein an edge part, covering the first pixel opening areas, of the first functional layer is a smooth edge; and
an area, where the first functional layer covers, of the first pixel opening areas and the second pixel opening areas is an effective display area;
wherein the first functional layer comprises at least one film layer of film layers; and each film layer in the first functional layer is a continuous whole film layer.

2. The display panel according to claim 1, wherein the light emitting structure comprises the film layers; and the film layers comprise a hole injection layer, a hole transport layer, a luminescent material layer, an electron transport layer, and an electron injection layer.

3. The display panel according to claim 2, wherein the first functional layer comprises at least two film layers;
wherein edges of parts, arranged in the first pixel opening areas, of the at least two film layers in the first functional layer are aligned.

4. The display panel according to claim 2, wherein the luminescent material layer and/or the hole transport layer are/is configured as the first functional layer;
wherein the light emitting structure comprises organic light emitting diode (OLED) devices in one color; the OLED devices comprise the film layers; and each of the film layers is a continuous whole film layer.

5. The display panel according to claim 2, wherein the light emitting structure comprises OLED devices in different colors;
and one or two of the hole injection layer, the hole transport layer, the luminescent material layer, the electron transport layer, and the electron injection layer are provided with patterns.

6. The display panel according to claim 5, wherein the first functional layer comprises the hole transport layer.

7. The display panel according to claim 1, wherein the display area further comprises third pixel opening areas, wherein the third pixel opening areas are arranged between the first pixel opening areas and the heterotypic edge of the display area.

8. The display panel according to claim 7, wherein sizes of the first pixel opening areas, sizes of the second pixel opening areas, and sizes of the third pixel opening areas are the same.

9. The display panel according to claim 1, wherein the driving backplane comprises a pixel defining structure, wherein the pixel defining structure is configured to form the first pixel opening areas, the second pixel opening areas, and third pixel opening areas which define the display area.

10. The display panel according to claim 1, further comprising a first electrode layer arranged on a side, facing away from the driving backplane, of the light emitting structure,
wherein the first electrode layer completely covers the display area.

11. A display device, comprising the display panel according to claim 1.

12. A method for preparing a display panel, comprising:
forming a light emitting structure on a driving backplane;
wherein the light emitting structure comprises a first functional layer; the driving backplane comprises a display area, the display area is provided with a heterotypic edge, and the display area comprises a plurality of first pixel opening areas close to the heterotypic edge and a plurality of second pixel opening areas away from the heterotypic edge;

wherein each of the second pixel opening areas is completely covered by the first functional layer, and each of the first pixel opening areas is partially covered by the first functional layer;

an edge part, covering the first pixel opening areas, of the first functional layer is a smooth edge; and an area, where the first functional layer covers, of the first pixel opening areas and the second pixel opening areas is an effective display area;

wherein the first functional layer comprises at least one film layer of film layers; and each film layer in the first functional layer is a continuous whole film layer.

13. The method according to claim 12, wherein said forming the first functional layer in the light emitting structure comprises:

when the first functional layer comprises one of the film layers, evaporating the one film layer by an evaporation process; or, when the first functional layer comprises at least two of the film layers, evaporating the at least two film layers of the first functional layer sequentially by an evaporation process;

wherein the film layers comprise a hole injection layer, a hole transport layer, a luminescent material layer, an electron transport layer, and an electron injection layer.

14. The method according to claim 13, wherein said evaporating the one film layer by the evaporation process comprises:

evaporating the one film layer of the first functional layer by using one mask;

wherein said evaporating the at least two film layers of the first functional layer sequentially by the evaporation process comprises:

evaporating the at least two film layers of the first functional layer by using one mask.

* * * * *